(12) United States Patent
Nakajima

(10) Patent No.: US 7,045,448 B2
(45) Date of Patent: May 16, 2006

(54) SEMICONDUCTOR DEVICE AND METHOD OF FABRICATING THE SAME

(75) Inventor: Kazuaki Nakajima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/979,275

(22) Filed: Nov. 3, 2004

(65) Prior Publication Data

US 2005/0263824 A1    Dec. 1, 2005

(30) Foreign Application Priority Data

May 25, 2004    (JP) .............................. 2004-154406

(51) Int. Cl.
*H01L 21/3205*    (2006.01)
*H01L 21/4763*    (2006.01)

(52) U.S. Cl. ...................... 438/585; 438/586; 438/587; 438/588; 438/592

(58) Field of Classification Search ........ 438/585–588, 438/592; 257/388, 407, 412, 413
See application file for complete search history.

(56) References Cited

U.S. PATENT DOCUMENTS 6,518,642 B1    2/2003  Kim et al.
6,555,450 B1    4/2003  Park et al.
6,586,809 B1    7/2003  Segawa
2004/0043595 A1 *  3/2004  Lee et al. ................... 438/592

FOREIGN PATENT DOCUMENTS

| JP | 11-214677 | 8/1999 |
| JP | 2000-133705 | 5/2000 |
| JP | 2000-216242 | 8/2000 |
| JP | 2000-353803 | 12/2000 |

* cited by examiner

*Primary Examiner*—Thien F. Tran
(74) *Attorney, Agent, or Firm*—Finnegan, Henderson, Farabow, Garrett & Dunner, L.L.P.

(57) ABSTRACT

According to the present invention, there is provided a semiconductor device, comprising:
  a gate electrode formed on a substrate via a gate insulating film by using a first silicide film;
  diffusion layers formed in a surface portion of said substrate so as to be positioned at two ends of a channel region below said gate electrode, and having a second silicide film on surfaces thereof;
  a first insulating film formed on said second suicide film of said diffusion layers; and
  a second insulating film continuously formed on said first insulating film and said gate electrode,
  wherein a total film thickness of said first and second insulating films on said second silicide film is larger than a film thickness of said second insulating film on said gate electrode.

12 Claims, 11 Drawing Sheets

SEMICONDUCTOR DEVICE AND METHOD OF FABRICATING THE SAME

CROSS REFERENCE TO RELATED APPLICATION

This application is based upon and claims benefit of priority under 35 USC §119 from the Japanese Patent Application No. 2004-154406, filed on May 25, 2004, the entire contents of which are incorporated herein by reference.

BACKGROUND OF THE INVENTION

The present invention relates to a semiconductor device and a method of fabricating the same and, more particularly, to a semiconductor device having a MIS (Metal Insulator Semiconductor) transistor using a metal silicide electrode and a method of fabricating the same.

To realize high performance of MOSFETs, micropatterning of devices have been sought until today.

Unfortunately, the scaling of gate oxide films is said to be limited in devices on and after the 0.1-μm generation. This is so because the increase in gate leakage current caused by a tunneling current becomes significant as the gate oxide film thickness decreases.

In addition, depletion of the gate electrode is no longer negligible in this generation, so it is presently impossible to freely decrease the effective oxide film thickness.

As a method of avoiding this problem, it is being attempted to increase the dielectric constant of a gate insulating film or to use a metal gate electrode.

The purpose of the former is to increase the physical film thickness and suppress a tunneling current by replacing a gate insulating film with a high-dielectric film.

The purpose of the latter is to prevent depletion of the gate electrode by metallizing it.

Recently, the development of the materials of high-dielectric gate insulating films is being extensively done, and new materials such as $HfO_2$ and $La_2O_3$ are reported in learned societies. This produces the competition of decreasing the effective oxide film thickness.

On the other hand, the study of metal gate electrodes is not so extensively done as the development of high-dielectric films. However, as shown in the ITRS 2001 Road Map, in a region where the physical film thickness is less than 1.2 nm, it is presumably difficult to realize a transistor by using an electrode made of the conventional polysilicon.

The influence of depletion of the gate electrode on the effective oxide film thickness is about 0.3 nm. However, to extend the life of silicon-based oxide films to this generation, the development of metal gate electrodes is essential. In particular, the competition of the development of full-silicide electrode processes is advancing because this process is superior in matching with the conventionally used CMOS process.

Unfortunately, in the full-silicide electrode processes, silicide films different in thickness must be separately formed on a diffusion layer and a gate electrode in order to form both a shallow junction and a low-resistance gate electrode.

To protect the device from an oxidizing ambient, the surface of a silicide film must be covered with a silicon nitride film. In the conventional method, an interlayer insulating film structure made of a silicon oxide film on a diffusion layer is sandwiched by silicon nitride films. Therefore, when contact holes are to be simultaneously formed on the diffusion layer and the gate electrode, the etching amount on the gate electrode side excessively increases. In the worst case, etching advances through the gate electrode.

The references disclosing the conventional silicide electrode processes are as follows.

Patent Reference 1: Japanese Patent Laid-Open No. 2000-133705
Patent Reference 2: Japanese Patent Laid-Open No. 2000-353803
Patent Reference 3: Japanese Patent Laid-Open No. 2000-216242
Patent Reference 4: Japanese Patent Laid-Open No. 11-214677
Patent Reference 5: U.S. Pat. No. 6,518,642
Patent Reference 6: U.S. Pat. No. 6,555,450
Patent Reference 7: U.S. Pat. No. 6,586,809

SUMMARY OF THE INVENTION

According to one aspect of the present invention, there is provided a semiconductor device fabrication method, comprising:

forming a gate electrode on a substrate via a gate insulating film by using a silicon-containing material;

depositing an insulating material on the gate electrode and the substrate, and etching back the insulating film, thereby forming a first insulating film so as to expose a surface of the substrate, and cover surfaces of the gate electrode;

ion-implanting an impurity by using the gate electrode and the first insulating film as masks, thereby selectively forming a diffusion layer in a surface portion of the substrate;

forming a first metal film on at least the substrate, and allowing the first metal film to react with the substrate by annealing, thereby forming a silicide film in a surface portion of the diffusion layer;

forming a second insulating film so as to cover the gate electrode, which is covered with the first insulating film, and the substrate;

forming a third insulating film as an interlayer insulating film on the second insulating film;

planarizing the first, second, and third insulating films to a height at which upper surfaces of the gate electrode are exposed;

removing the third insulating film such that a predetermined selectivity to the second insulating film is obtained;

forming a second metal film on at least the gate electrode, and allowing the second metal film to react with the gate electrode by annealing, thereby converting the material of the gate electrode into a metal silicide;

forming a fourth insulating film so as to cover the gate electrode and second insulating film;

forming a fifth insulating film as an interlayer insulating film on the fourth insulating film;

planarizing the fifth insulating film;

processing the fifth insulating film into a shape of a desired contact pattern such that a predetermined selectivity to the fourth insulating film is obtained;

selectively removing the fourth and second insulating films present on a bottom surface of the contact pattern of the fifth insulating film; and forming a contact by burying a conductive material in the contact pattern of the fifth insulating film.

According to one aspect of the present invention, there is provided a semiconductor device fabrication method, comprising:

forming a gate electrode on a substrate via a gate insulating film by using a silicon-containing material;

depositing an insulating material on the gate electrode and the substrate, and etching back the insulating material, thereby forming a first insulating film so as to expose a surface of the substrate and surfaces of the gate electrode, and cover side surfaces of the gate electrode;

ion-implanting an impurity by using the gate electrode and the first insulating film as masks, thereby selectively forming a diffusion layer in a surface portion of the substrate;

forming a first metal film on at least the gate electrode and the substrate, and allowing the first metal film to react with silicon contained in the gate electrode and the substrate by annealing, thereby forming a first silicide film in a surface portion of the diffusion layer, and a second silicide film in surface portions of the gate electrode;

forming a second insulating film so as to cover the gate electrode and the substrate;

forming a third insulating film as an interlayer insulating film on the second insulating film;

planarizing the second and third insulating films to a height at which an upper surface of the second silicide film is exposed;

removing the third insulating film such that a predetermined selectivity to the second insulating film is obtained;

forming a second metal film on at least the second silicide film, and allowing the second metal film to react with the second silicide film by annealing, thereby converting the material of the gate electrode into a metal silicide;

forming a fourth insulating film so as to cover the gate electrode and second insulating film;

forming a fifth insulating film as an interlayer insulating film on the fourth insulating film;

planarizing the fifth insulating film;

processing the fifth insulating film into a shape of a desired contact pattern such that a predetermined selectivity to the fourth insulating film is obtained;

selectively removing the fourth and second insulating films present on a bottom surface of the contact pattern of the fifth insulating film; and forming a contact by burying a conductive material in the contact pattern of the fifth insulating film.

According to one aspect of the present invention, there is provided a semiconductor device, comprising:

a gate electrode formed on a substrate via a gate insulating film by using a first silicide film;

diffusion layers formed in a surface portion of said substrate so as to be positioned at two ends of a channel region below said gate electrode, and having a second silicide film on surfaces thereof;

a first insulating film formed on said second silicide film of said diffusion layers; and a second insulating film continuously formed on said first insulating film and said gate electrode, wherein a total film thickness of said first and second insulating films on said second suicide film is larger than a film thickness of said second insulating film on said gate electrode.

DETAILED DESCRIPTION OF THE INVENTION

Embodiments of the present invention will be described below with reference to the accompanying drawings.

(1) FIRST EMBODIMENT

A semiconductor device including a MIS transistor and a method of fabricating the same according to the first embodiment of the present invention will be described below with reference to drawings showing the longitudinal sections of elements in different fabrication steps.

Figure 1:
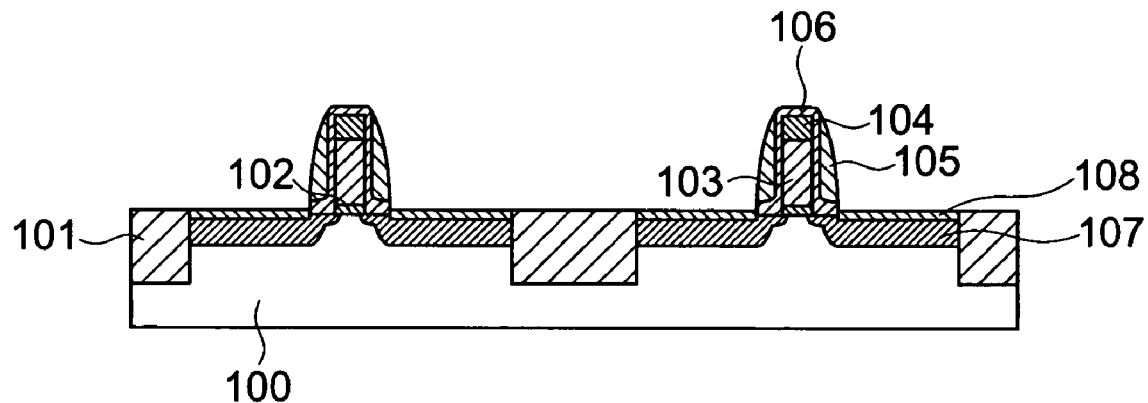
FIG. 1 is a longitudinal sectional view of elements showing a step of a semiconductor device fabrication method according to the first embodiment of the present invention.

As shown in FIG. 1, an element region is isolated by an element isolation film 101 in the surface portion of a single-crystal silicon substrate 100. On this element region, a gate oxide film 102 is formed. On the gate oxide film 102, a polysilicon film 103 having a film thickness of, e.g., 100 nm and a silicon nitride film 104 having a film thickness of, e.g., 100 nm are deposited.

The polysilicon film 103 and silicon nitride film 104 are formed into the shape of an electrode pattern by anisotropic etching such as RIE, thereby forming gate electrodes.

These gate electrodes are used as masks to ion-implant, e.g., $As^+$ ions into an n-type MOS transistor region and $B^+$ ions into a p-type MOS transistor region. In addition, annealing is performed at, e.g., 800° C. for 5 sec to form diffusion layers.

A silicon oxide film 106 having a film thickness of, e.g., 30 nm and a silicon nitride film 105 having a film thickness of, e.g., 30-nm are deposited. The silicon oxide film 106 and silicon nitride film 105 are etched back to cover, with the silicon oxide film 106, the surface of the electrode pattern made up of the polysilicon film 103 and the silicon nitride film 104 formed on it, and leave the silicon nitride film 105 behind on the sidewalls of the electrode pattern, thereby surrounding the electrode pattern by the silicon nitride film 105 and silicon oxide film 106.

The gate electrode pattern including the sidewalls made up of the silicon nitride film 105 and silicon oxide film 106 is used as a mask to ion-implant, e.g., $P^+$ ions into the n-type MOS transistor region and $B^+$ ions into the p-type MOS transistor region. Then, annealing is performed at, e.g., 1,000° C. for 5 sec to form diffusion layers 107 as a source and drain.

An Ni film is formed by PVD. This Ni film is allowed to react with the silicon substrate 100 by performing annealing at, e.g., 350° C. for 3 sec. After the unreacted Ni film is removed, annealing is performed at, e.g., 500° C. for 3 sec to form an Ni silicide film 108 on the diffusion layers 107.

Figure 2:
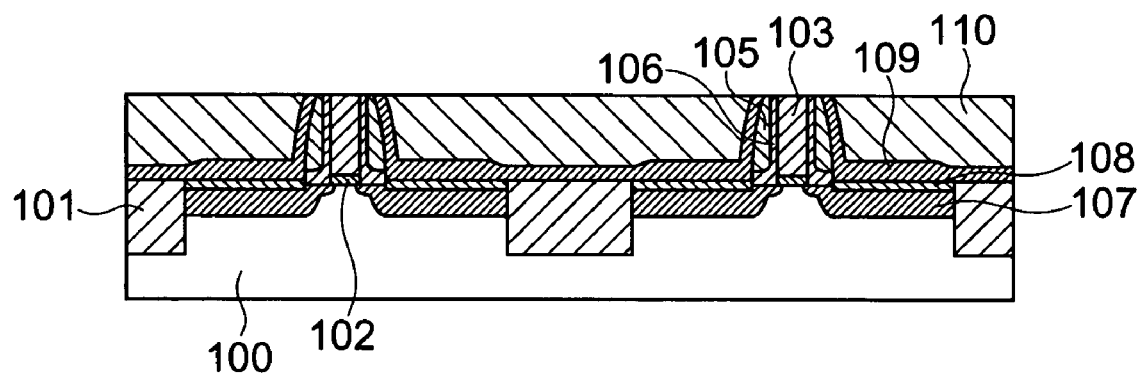
FIG. 2 is a longitudinal sectional view of elements showing another step of the semiconductor device fabrication method according to the first embodiment.

After that, as shown in FIG. 2, a first silicon nitride film 109 having a film thickness of, e.g., 20 nm is deposited as a film for preventing oxidation on the surface of the Ni silicide film 108, and as an etching stopper film when contact holes are formed.

A first interlayer insulating film 110 having a film thickness of, e.g., 300 nm is deposited on the entire surface. The first interlayer insulating film 110 is then planarized by chemical mechanical polishing (CMP) until the surface of the polysilicon film 103 is exposed.

If the silicon nitride film 104 or the silicon nitride film 104 and first silicon nitride film 109 remain on the polysilicon film 103 when planarization is performed by CMP, these films are removed by using etching back or the like, thereby exposing the surface of the polysilicon film 103.

P ions, for example, are implanted into the polysilicon film 103 in the n-type MOS transistor region, and B ions, for example, are implanted into the polysilicon film 103 in the p-type MOS transistor region.

These impurities doped into the polysilicon film 103 by ion implantation are evenly diffused in the direction of thickness of the polysilicon film 103 by performing annealing at, e.g., 900° C. for about 10 sec.

The subsequent steps of this embodiment will be described later with reference to FIGS. 7 to 12. Before that, the subsequent steps of a semiconductor device fabrication method as a comparative example will be described below with reference to FIGS. 3 to 6.

Figure 3:
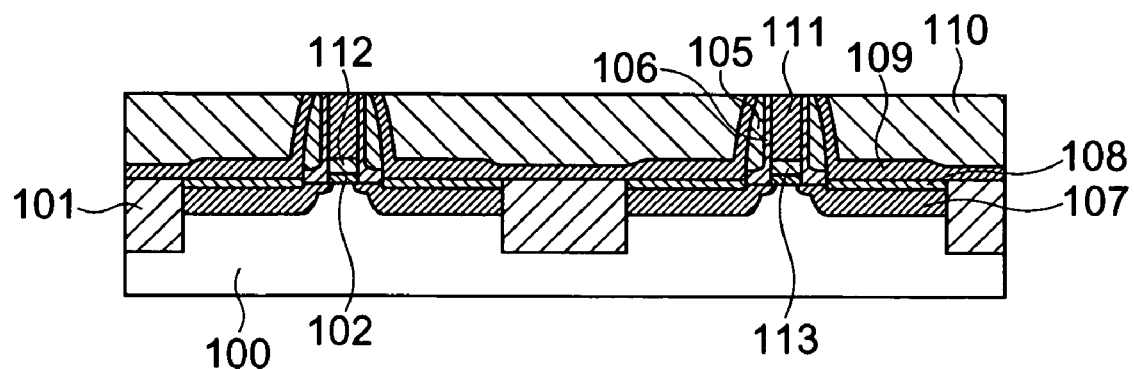
FIG. 3 is a longitudinal sectional view of elements showing a step of a semiconductor device fabrication method as a comparative example.

In the step shown in FIG. 3, an Ni film, for example, is formed by PVD. This Ni film is allowed to react with the polysilicon film 103 by performing annealing at 450° C. for 60 sec, thereby converting the polysilicon film 103 in the gate electrode into an Ni silicide film 111.

The unreacted Ni is peeled off by a solution mixture of, e.g., sulfuric acid and hydrogen peroxide water.

In the n-type MOS transistor region into which P is ion-implanted, this P segregates in a P segregation film 112 positioned in the interface between the Ni silicide film 111 and silicon oxide film 102. In the p-type MOS transistor region into which B is ion-implanted, this B segregates in a B segregation film 113 positioned in the interface between the Ni suicide film 111 and silicon oxide film 102.

As a consequence, the work function of the silicide electrode changes by about −0.2 eV in the n-type MOS transistor region, and changes by about +0.2 eV in the p-type MOS transistor region. Accordingly, metal gate electrodes having two different work functions can be formed by the metal silicide electrodes (Ni silicide film 111) and the ion implantation technique.

Figure 4:
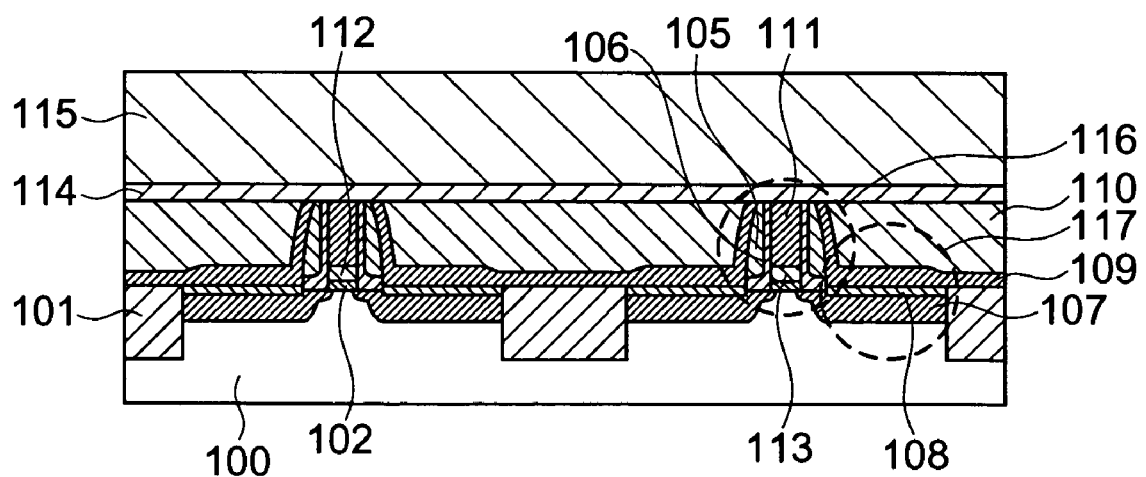
FIG. 4 is a longitudinal sectional view of elements showing a step of a semiconductor device fabrication method as the comparative example.

As shown in FIG. 4, a second silicon nitride film 114 having a film thickness of, e.g., 20 nm is deposited on the entire surface as a silicide surface anti-oxidizing film of the gate electrode, and a second interlayer insulating film 115 having a film thickness of, e.g., 600 nm is deposited on the entire surface of the second silicon nitride film 114. In the following steps, as shown in FIG. 4, reference numeral 116 denotes the gate electrode including the Ni silicide film 111, and the silicon nitride film 105 and silicon oxide film 106 as the sidewalls; and 117, the diffusion layer including the diffusion layer 107 and Ni silicide film 108.

In this state, the second silicon nitride film 114 and second interlayer insulating film 115 are stacked on the gat electrode 116. Also, on the diffusion layer 117, the first silicon nitride film 109, first interlayer insulating film 110, second silicon nitride film 114, and second interlayer insulating film 115 are stacked.

Figure 5:
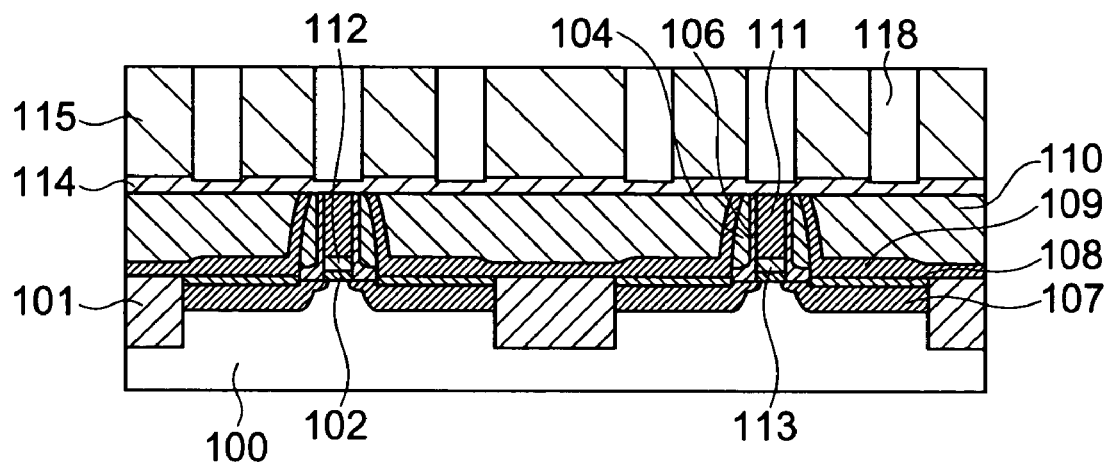
FIG. 5 is a longitudinal sectional view of elements showing a step of a semiconductor device fabrication method as the comparative example.

As shown in FIG. 5, a resist film (not shown) having a desired contact pattern 118 is formed on the second interlayer insulating film 115, and used as a mask to etch the second interlayer insulating film 115.

Figure 6:
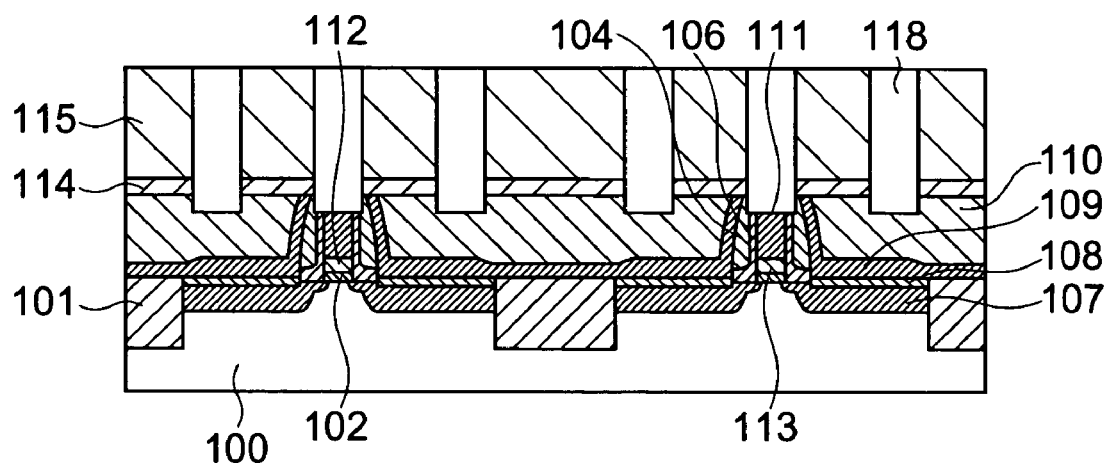
FIG. 6 is a longitudinal sectional view of elements showing a step of a semiconductor device fabrication method as the comparative example.

As shown in FIG. 6, the second silicon nitride film 114 whose surface is exposed to the bottom surface of the contact pattern 118 is etched. In this state, the surface of the gate electrode 111 is already exposed. However, the surface of the diffusion layer 117 is not exposed, and the first silicon nitride film 109 and first interlayer insulating film 110 remain on the diffusion layer 117 by an amount equivalent to the height of the gate electrode, i.e., about 100 nm.

To form a contact hole on the diffusion layer 117, therefore, it is necessary to further etch the first interlayer insulating film 110 and first silicon nitride film 109. Consequently, the gate electrode 116 is excessively etched by the height of the gate electrode. In the worst case, the diffusion layer is removed through the gate electrode.

Figure 7:
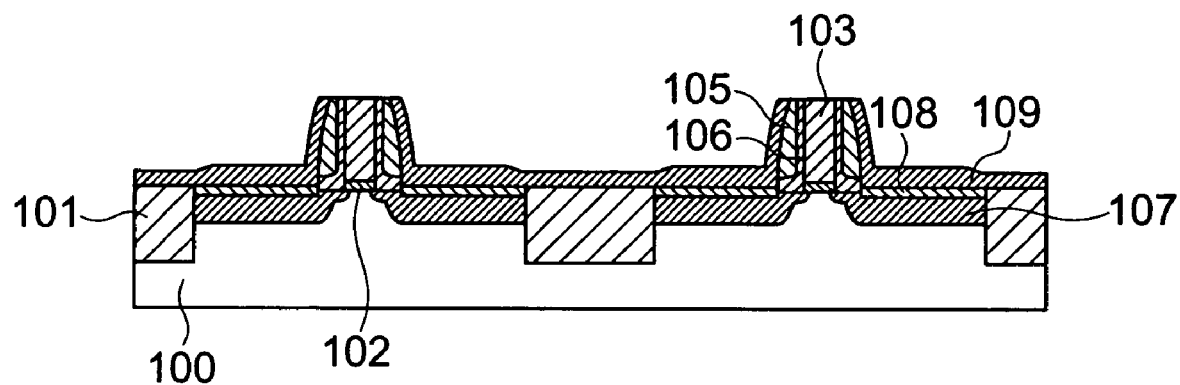
FIG. 7 is a longitudinal sectional view of elements showing another step of the semiconductor device fabrication method according to the first embodiment.

To avoid this phenomenon, in the fabrication method according to this embodiment, the first interlayer insulating film 110 is selectively removed from the first silicon nitride film 109, as shown in FIG. 7, following the step shown in FIG. 2.

Figure 8:
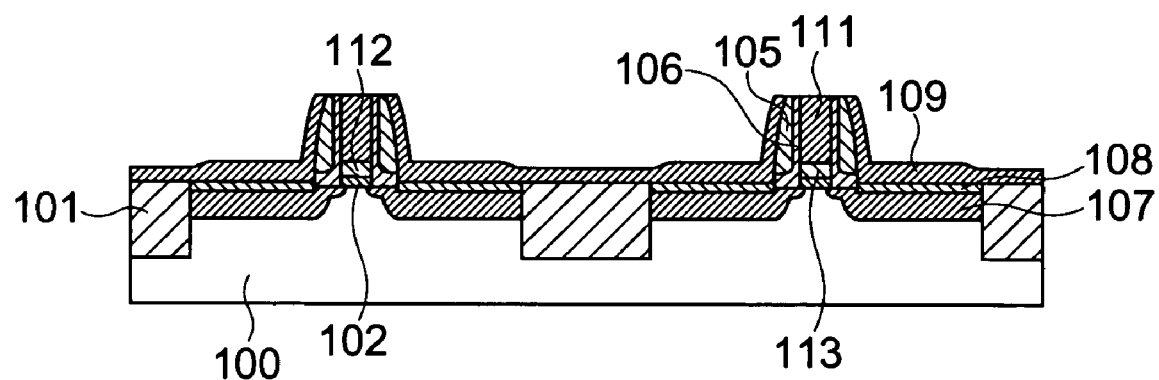
FIG. 8 is a longitudinal sectional view of elements showing another step of the semiconductor device fabrication method according to the first embodiment.

Referring to FIG. 8, an Ni film (not shown), for example, is formed by PVD. This Ni film is allowed to react with the polysilicon film 103 by performing annealing at, e.g., 450° C. for 60 sec, thereby converting the polysilicon film 103 as the gate electrode into an Ni silicide film 111. The unreacted Ni film is peeled off by a solution mixture of, e.g., sulfuric acid and hydrogen peroxide water.

In this state, the diffusion layer 107 and the silicide film 108 on it are covered with the first silicon nitride film 109, and hence do not react with the Ni film.

Figure 9:
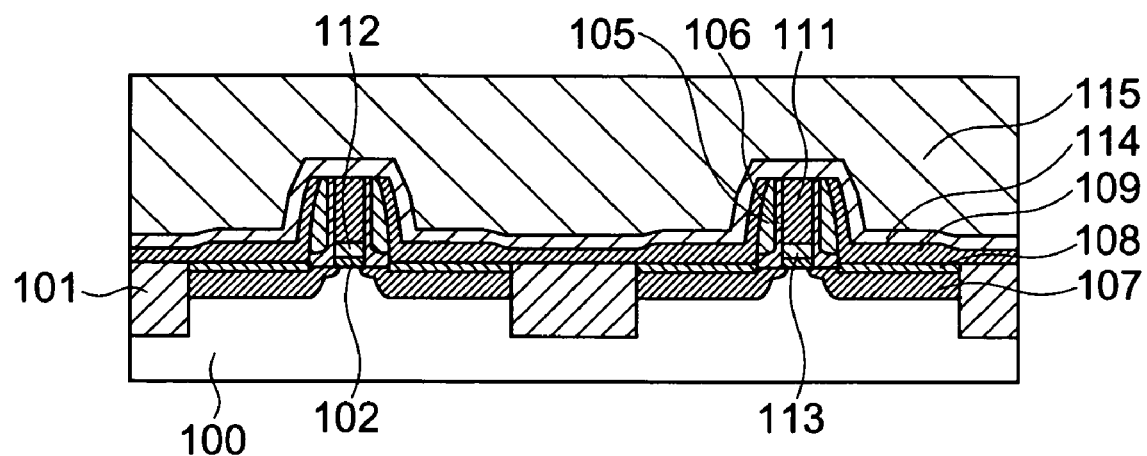
FIG. 9 is a longitudinal sectional view of elements showing another step of the semiconductor device fabrication method according to the first embodiment.

As shown in FIG. 9, as an anti-oxidizing film of the Ni silicide film 111 of the gate electrode, a second silicon nitride film 114 having a film thickness of, e.g., 20 nm is deposited. On the entire surface of second silicon nitride film 114, a silicon oxide film having a film thickness of, e.g., 600 nm is deposited as a second interlayer insulating film 115. The second interlayer insulating film 115 is planarized by CMP or the like.

In this stage, the second silicon nitride film 114 and second interlayer insulating film 115 are stacked on the Ni silicide film 111 of the gate electrode. Also, on the silicide film 108 on the surface of the diffusion layer 107, the first silicon nitride film 109, second silicon nitride film 114, and second interlayer insulating film 115 are stacked.

Figure 10:
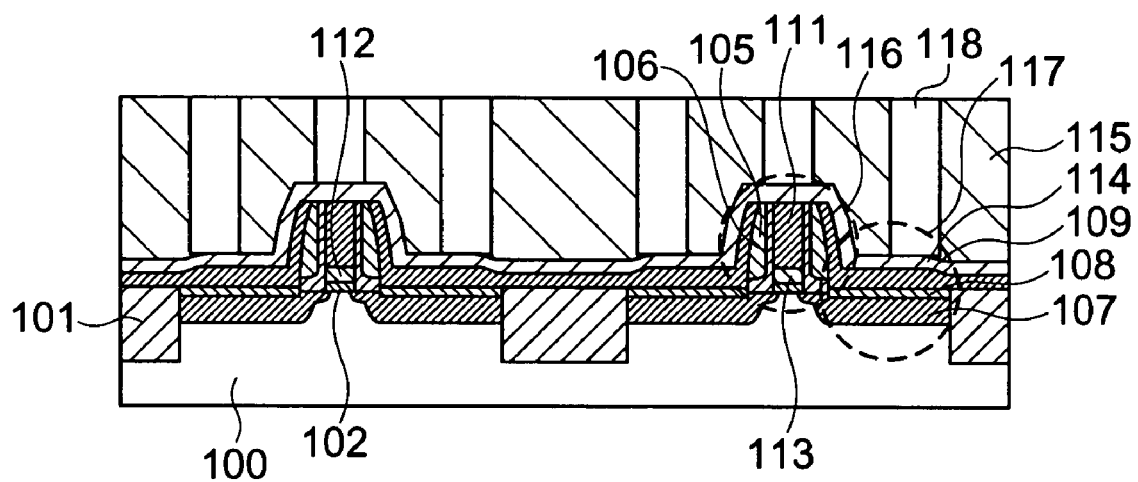
FIG. 10 is a longitudinal sectional view of elements showing another step of the semiconductor device fabrication method according to the first embodiment.

As shown in FIG. 10, a resist film (not shown) having a desired contact pattern 118 is formed on the second interlayer insulating film 115. This resist film is used as a mask to selectively etch the second interlayer insulating film 115 from the second silicon nitride film 114.

In the following steps, as shown in FIG. 10, reference numeral 116 denotes the gate electrode including the Ni silicide film 111, and the silicon oxide film 106 and silicon nitride film 105 as the sidewalls; and 117, the diffusion layer including the diffusion layer 107 and Ni silicide film 108.

When the second interlayer insulating film 115 is etched into the shape of the contact pattern 118, the 20-nm thick second silicon nitride film 114 is present on the gate electrode 116.

On the diffusion layer 117, the first silicon nitride film 109 and second silicon nitride film 114 are present, i.e., the silicon nitride films having a total film thickness of 40 nm remain.

Figure 11:
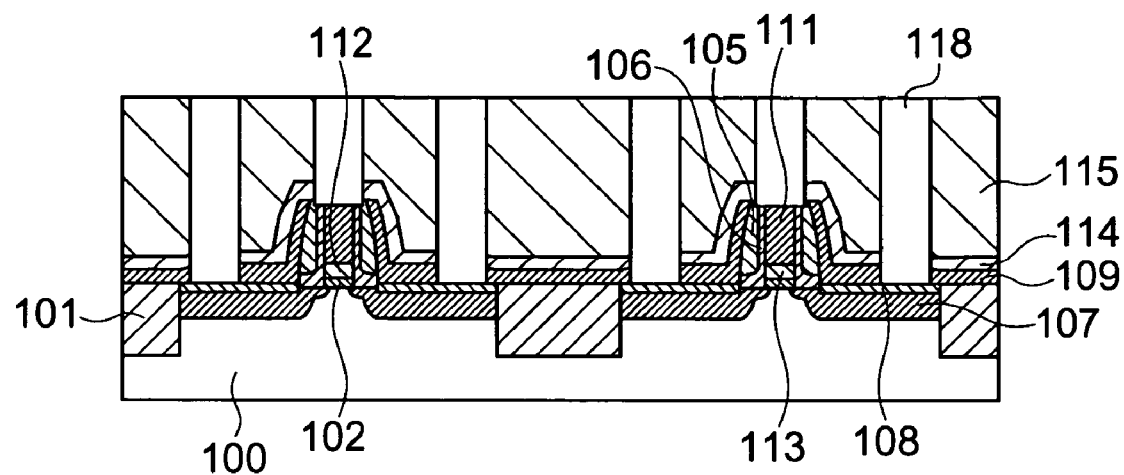
FIG. 11 is a longitudinal sectional view of elements showing another step of the semiconductor device fabrication method according to the first embodiment.

As shown in FIG. 11, therefore, the silicon nitride films 109 and 114 on the diffusion layer 117 on the bottom surface of the contact pattern 118 of the second interlayer insulating film 115 are etched away.

In this stage, the silicon nitride film 114 is present but the silicon nitride film 109 is not present on the gate electrode 116. Therefore, etching is excessively done by a thickness of 20 nm of the silicon nitride film 109. However, this etching amount is small, so etching does not penetrate to the gate electrode 116.

Figure 12:
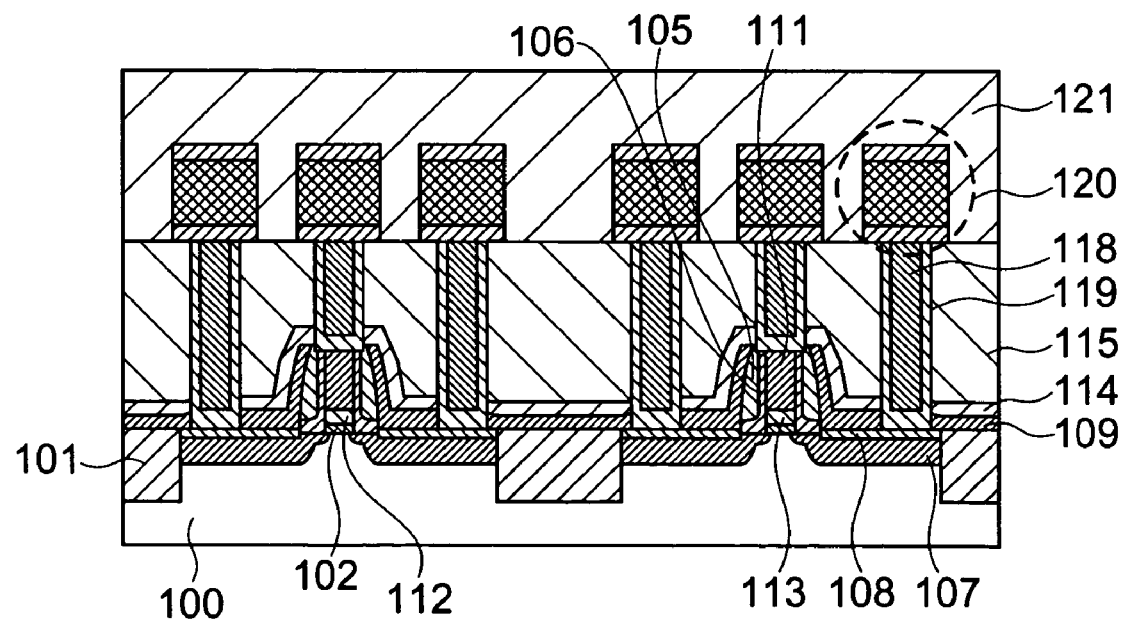
FIG. 12 is a longitudinal sectional view of elements showing another step of the semiconductor device fabrication method according to the first embodiment.

As shown in FIG. 12, Ti/TiN/W films, for example, are buried in the contact pattern 118 of the second interlayer insulating film 115, and planarized by CMP to form contacts 119.

An Al film is deposited on the second interlayer insulating film 115 and contacts 119 and patterned into the shapes of interconnections, thereby forming Al interconnections 120 electrically connected to the contacts 119.

A third interlayer insulating film 121 is deposited on the Al interconnections 120 and second interlayer insulating film 115, and planarized by CMP.

The above fabrication steps make it possible to form contact holes on the diffusion layers and gate electrodes, and form CMOS transistors having silicide electrodes.

(2) SECOND EMBODIMENT

A semiconductor device and a method of fabricating the same according to the second embodiment of the present invention will be described below with reference to FIGS. 13 to 20.

Figure 13:
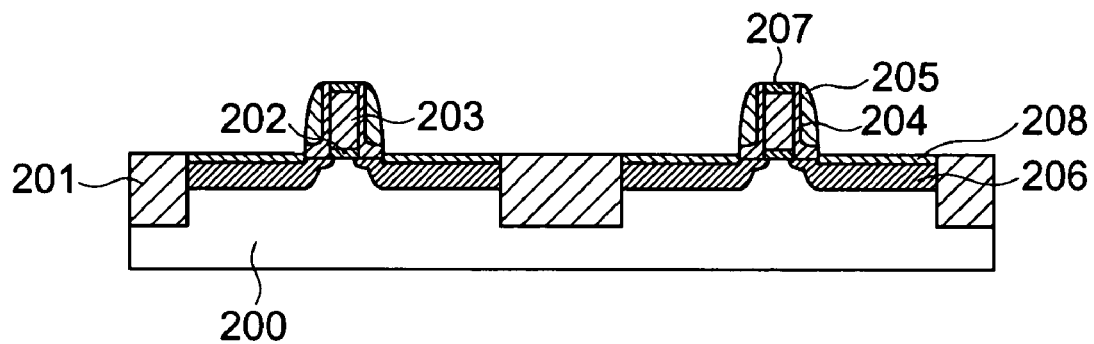
FIG. 13 is a longitudinal sectional view of elements showing a step of a semiconductor device fabrication method according to the second embodiment of the present invention.

As shown in FIG. 13, a hafnium silicon oxide film 202 as a gate oxide film is formed on an element region of a single-crystal silicon substrate 200 having an element isolation film 201. A polysilicon film 203 having a film thickness of, e.g., 100 nm is deposited on the hafnium silicon oxide film 202.

The polysilicon film 203 is formed into the shape of an electrode pattern by anisotropic etching, thereby forming gate electrodes.

These gate electrodes are used as masks to ion-implant, e.g., $As^+$ ions into an n-type MOS transistor region and $B^+$ ions into a p-type MOS transistor region. Annealing is performed at, e.g., 800° C. for 5 sec to form diffusion layers.

A silicon nitride film 204 having a film thickness of, e.g., 30 nm and a silicon oxide film 205 having a film thickness of, e.g., 30-nm are deposited, and etched back to form a structure in which the sidewalls of the electrode pattern is surrounded by the silicon nitride film 204 and silicon oxide film 205. In this stage, the surface of the polysilicon film 203 is exposed.

The gate electrode pattern including the sidewalls made up of the silicon nitride film 204 and silicon oxide film 205 is used as a mask to ion-implant, e.g., $P^+$ ions into the n-type MOS transistor region and $B^+$ ions into the p-type MOS transistor region. Annealing is performed at, e.g., 1,000° C. for 5 sec to form diffusion layers 206.

After that, a Co film is formed by PVD.

This Co film is allowed to react with the silicon substrate 200 by performing annealing at, e.g., 550° C. for 30 sec. After the unreacted Co film is removed, annealing is performed at, e.g., 765° C. for 30 sec to form a Co silicide film 208 on the diffusion layers 206, and a Co silicide film 207 on the polysilicon film 203.

Figure 14:
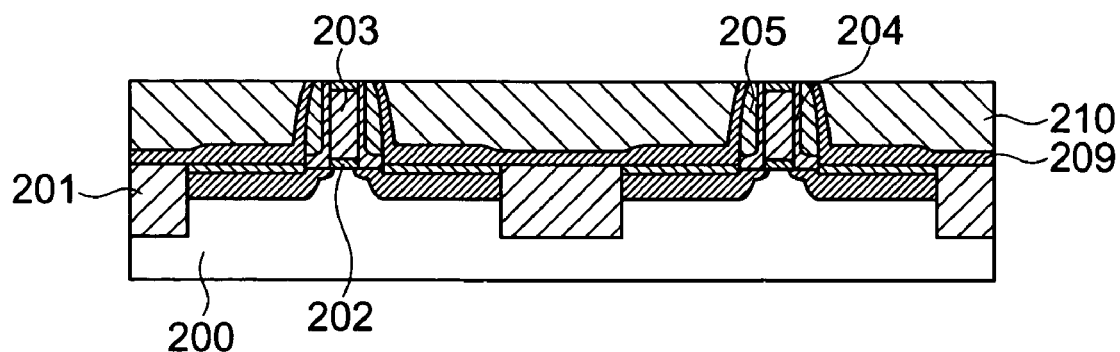
FIG. 14 is a longitudinal sectional view of elements showing another step of the semiconductor device fabrication method according to the second embodiment.

As shown in FIG. 14, a first silicon nitride film 209 having a film thickness of, e.g., 20 nm is deposited as a film for preventing oxidation on the surfaces of the Co silicide films 207 and 208, and as an etching stopper film when contact holes are formed.

A first interlayer insulating film 210 having a film thickness of, e.g., 300 nm is deposited on the entire surface. The first interlayer insulating film 210 is then planarized by chemical mechanical polishing (CMP) until the surface of the Co silicide film 207 on the polysilicon film 203 is exposed.

If the silicon nitride film 204 on the polysilicon film 103 and the first silicon nitride film 209 remain after CMP is performed, the silicon nitride film 204 and the first silicon nitride film 209 on the polysilicon film 203 are removed by using etching back or the like.

$As^+$ ions, for example, are implanted into the polysilicon film 203 in the n-type MOS transistor region, and In ions, for example, are implanted into the polysilicon film 203 in the p-type MOS transistor region.

Figure 15:
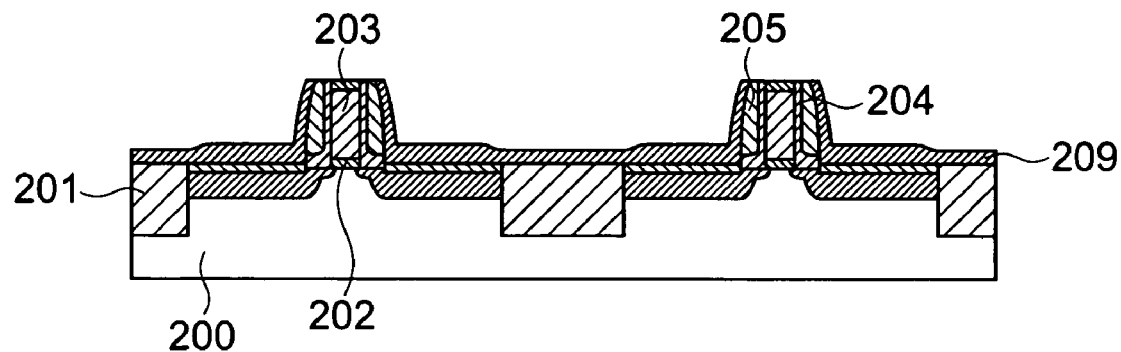
FIG. 15 is a longitudinal sectional view of elements showing another step of the semiconductor device fabrication method according to the second embodiment.

As shown in FIG. 15, the first interlayer insulating film 210 is selectively removed from the first silicon nitride film 209.

Figure 16:
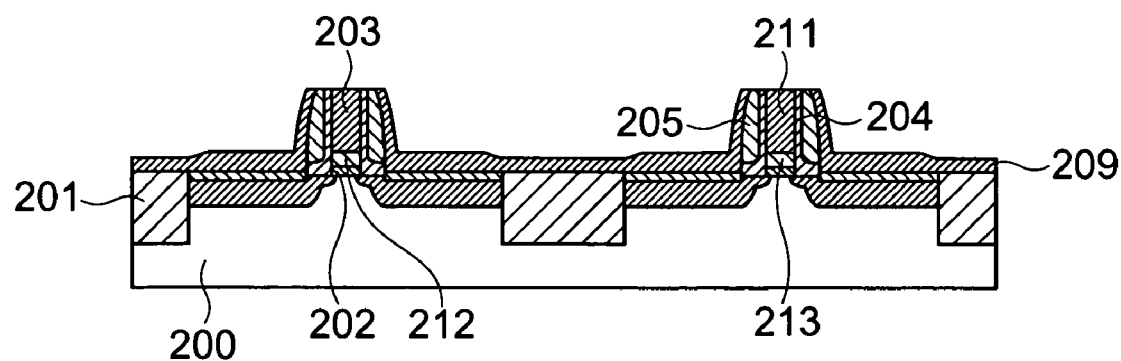
FIG. 16 is a longitudinal sectional view of elements showing another step of the semiconductor device fabrication method according to the second embodiment.

Referring to FIG. 16, an Ni film (not shown), for example, is formed by PVD.

This Ni film is allowed to react with the polysilicon film 203 via the Co silicide film 207 by performing annealing at, e.g., 450° C. for 60 sec, thereby converting the polysilicon film 203 as the gate electrode into a CoNi silicide film 211.

The unreacted Ni is peeled off by a solution mixture of, e.g., sulfuric acid and hydrogen peroxide water.

In this state, the diffusion layer 207 and the Co silicide film 208 on it are covered with the first silicon nitride film 209, and hence do not react with the Ni film.

In the n-type MOS transistor region into which As is ion-implanted, this As segregates in an As segregation film 212 positioned in the interface between the CoNi silicide film 211 and hafnium silicon oxide film 202. In the p-type MOS transistor region into which In is ion-implanted, this In segregates in an In segregation film 213 positioned in the interface between the CoNi silicide film 211 and hafnium silicon oxide film 202.

As a consequence, the work function of the silicide electrode changes by about −0.3 eV in the n-type MOS transistor region, and changes by about +0.3 eV in the p-type MOS transistor region.

In this embodiment as described above, metal gate electrodes having two different work functions can be formed by the metal silicide electrodes and the ion implantation technique.

Figure 17:
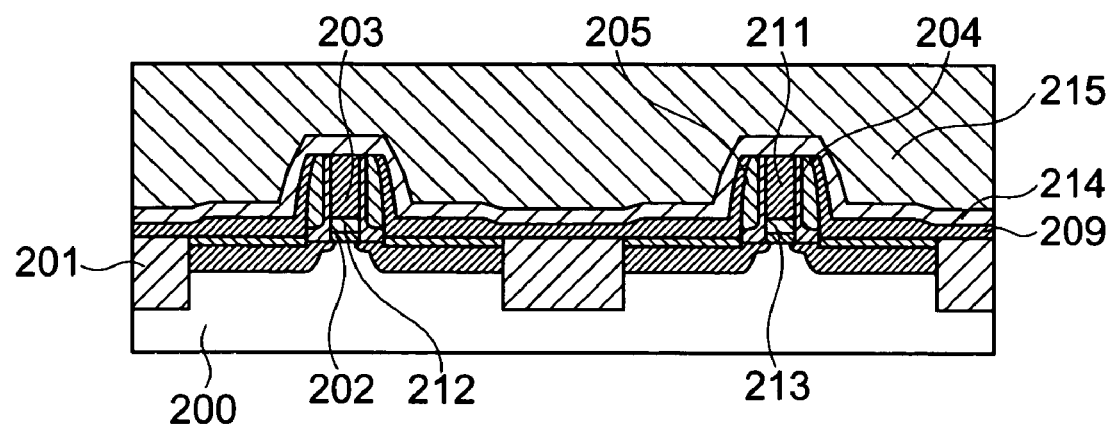
FIG. 17 is a longitudinal sectional view of elements showing another step of the semiconductor device fabrication method according to the second embodiment.

As shown in FIG. 17, a second silicon nitride film 214 having a film thickness of, e.g., 20 nm is deposited as a silicide surface anti-oxidizing film of the gate electrode. A second interlayer insulating film 215 having a film thickness of, e.g., 600 nm is deposited on the entire surface, and planarized by CMP or the like.

In this stage, the second silicon nitride film 214 and second interlayer insulating film 215 are stacked on the gat electrode 216. On the diffusion layer 217, the first silicon nitride film 209, second silicon nitride film 214, and second interlayer insulating film 215 are stacked.

Figure 18:
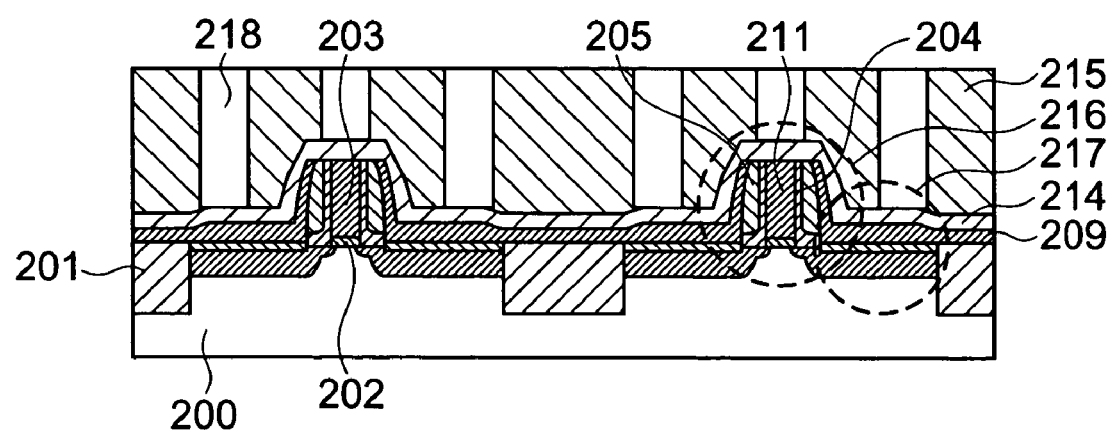
FIG. 18 is a longitudinal sectional view of elements showing another step of the semiconductor device fabrication method according to the second embodiment.

As shown in FIG. 18, a resist film (not shown) having a desired contact pattern 218 is formed on the second interlayer insulating film 215, and used as a mask to selectively etch the second interlayer insulating film 115 from the second silicon nitride film 214.

Figure 19:
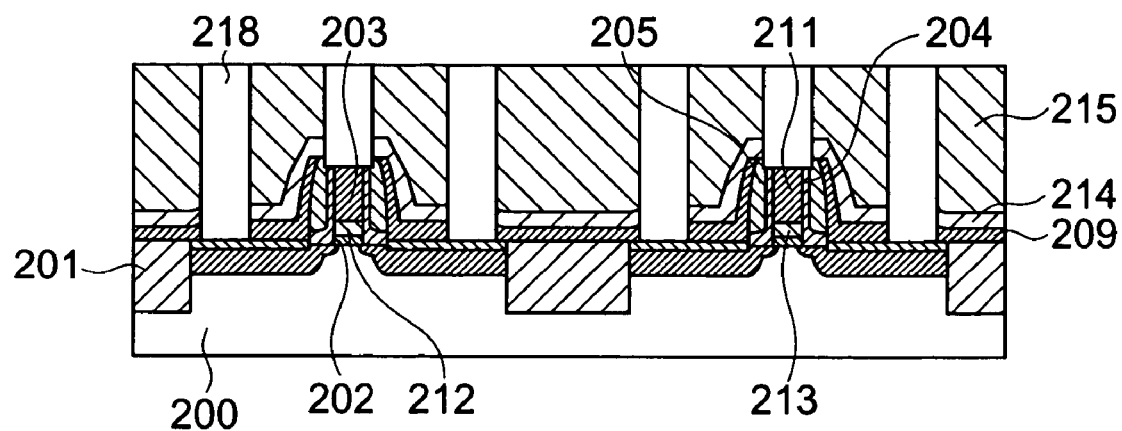
FIG. 19 is a longitudinal sectional view of elements showing another step of the semiconductor device fabrication method according to the second embodiment.

As shown in FIG. 19, the 20-nm thick second silicon nitride film 214 is present on the bottom surface of the contact pattern 218 on the gate electrode 116. On the diffusion layer 217, the first silicon nitride film 109 and second silicon nitride film 114 are present, i.e., the silicon nitride films having a total film thickness of 40 nm are present.

When the silicon nitride films 209 and 214 on the diffusion layer 217 are removed, therefore, the gate electrode 216 is excessively etched by the difference between the thicknesses of the silicon nitride films, i.e., by 20 nm. However, this etching amount is small, so etching does not penetrate through the gate electrode 216.

Figure 20:
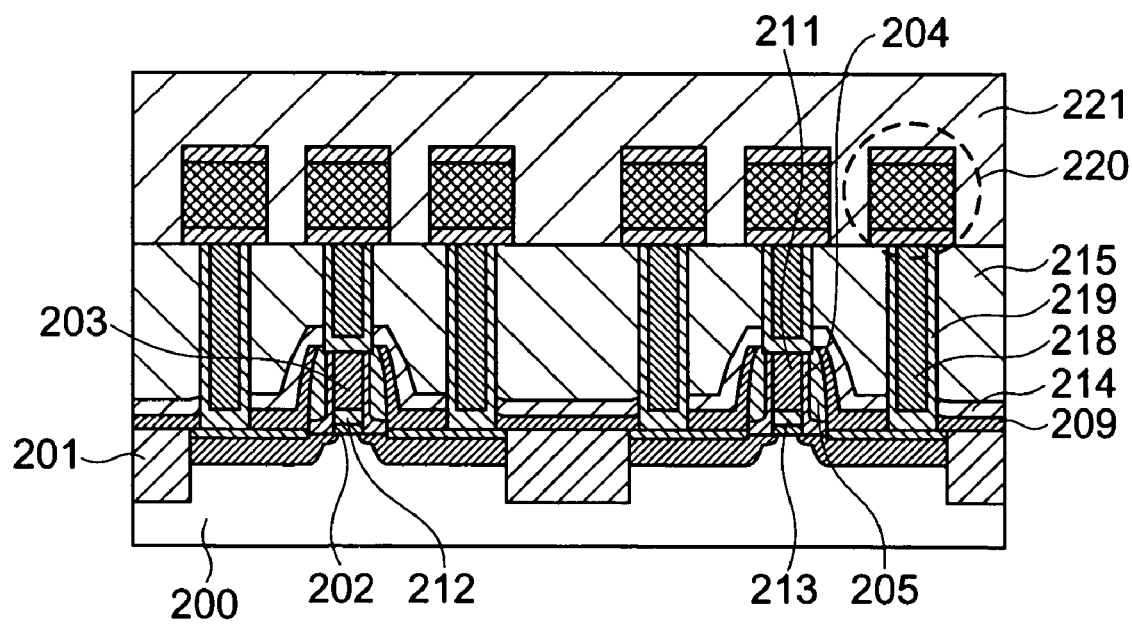
FIG. 20 is a longitudinal sectional view of elements showing another step of the semiconductor device fabrication method according to the second embodiment.

As shown in FIG. 20, Ti/TiN/W films, for example, are buried in the contact pattern 218, and planarized by CMP to form contacts 219.

Subsequently, Al interconnections 220 electrically connected to the contacts 119 are formed, and a third interlayer insulating film 221 is deposited and planarized by CMP.

The above fabrication steps make it possible to form contact holes on the diffusion layers and gate electrodes without any problem, and form CMOS transistors having silicide electrodes.

The structure of the MIS transistor in the semiconductor device formed in the first or second embodiment will be described below.

Figure 21:
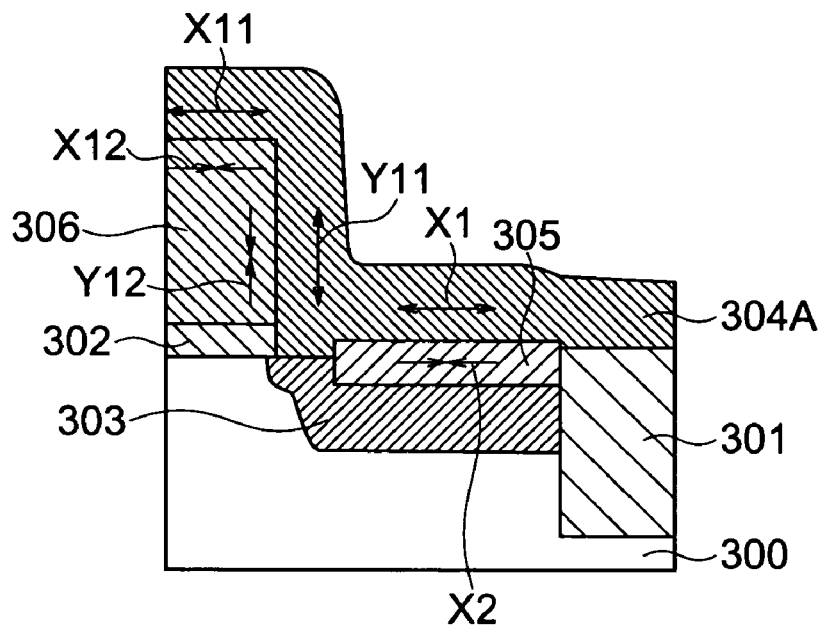
FIG. 21 is a longitudinal sectional view showing the structure of a MIS transistor as a comparative example.

As shown in FIG. 21, in a MIS transistor as a comparative example, a hafnium oxide film 302 as a gate insulating film and an Ni suicide film 306 as a gate electrode are formed on a single-crystal silicon substrate 300 having an element isolation film 301, and an Ni silicide film 305 is formed on a diffusion layer 303.

Generally, an increase in junction leakage current and a rise in sheet resistance caused by aggregation are problems of a silicide.

Especially when a silicide aggregates on a diffusion layer required to have a shallow junction, the junction leakage current increases. This not only deteriorates the transistor performance, but also decreases the yield.

When silicide formation of the gate electrode must be performed after silicide formation of the diffusion layer as in the first or second embodiment, a thermal budget necessary in the silicide formation of the gate electrode is applied to the silicide of the diffusion layer.

Accordingly, compared to a generally performed salicide process in which salicides are formed in the gate electrode and diffusion layer at the same time, a thermal budget applied to the diffusion layer is large and the silicide in the diffusion layer readily aggregates in the first or second embodiment.

Various methods are proposed to suppress the aggregation of a silicide. One method is to suppress the aggregation of a silicide by a cap film made of a silicon nitride film.

When a cap film 304A in which a tensile stress of 1 GP1 acts in the directions of arrows X1 shown in FIG. 21 is formed on the silicide film 305, a compression stress acts in the directions of arrows X2 in the silicide film 305, and this suppresses aggregation.

On the other hand, in the Ni silicide film 306 on the gate electrode side, the tensile stress of the cap film 304A is applied in the directions of arrows X11 on the upper surface of the gate electrode, and the directions of arrows Y11 on the two side surfaces of the gate electrode. Therefore, a compression stress acts in the directions of arrows X12 and arrows Y12 in the suicide film 306.

Accordingly, the vertical and horizontal stresses concentrate to the end portions of the upper surface of the gate electrode. As a consequence, if the stress caused by the cap film 304A exceeds, e.g., 3 GPa, film peeling occurs between the silicide film 306 and cap film 304A.

In the MIS transistor structure having the gate structure made of the silicide film 306 and the diffusion layer on the surface of which a silicide film is formed as in the first or second embodiment, therefore, it is necessary to avoid stress concentration to the end portions of the upper surface of the gate electrode, and at the same time apply a tensile stress of, e.g., 1 GPa or more to the silicide film on the diffusion layer.

Figure 22:
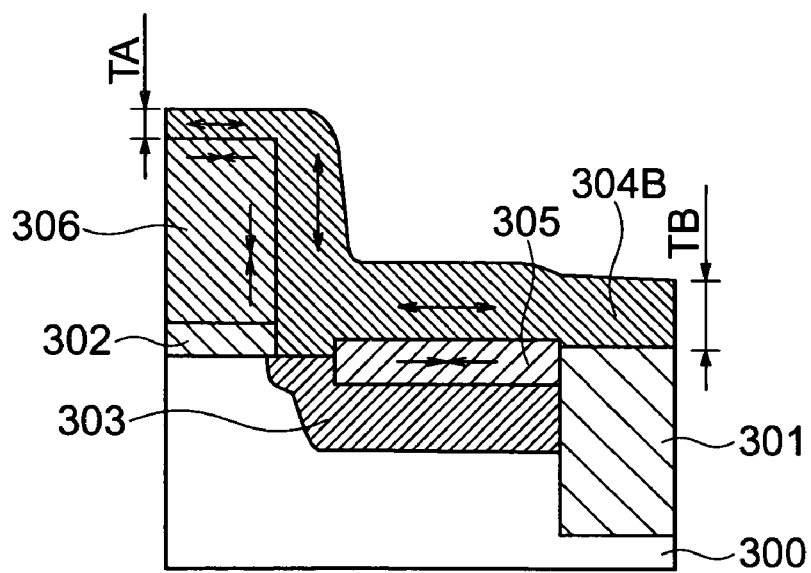
FIG. 22 is a longitudinal sectional view showing the structure of a MIS transistor according to the first or second embodiment.

In the MIS transistor according to the first or second embodiment, as shown in FIG. 22, the film thickness of a cap film 304B is set such that a film thickness TB on the diffusion layer is larger than a film thickness TA on a region where no contact is formed on the gate electrode. This makes it possible to reduce stress concentration to the end portions of the gate electrode, and apply an appropriate tensile stress to a silicide film 305 on the diffusion layer. Consequently, it is possible to avoid peeling of the cap film 304B at the end portions of the upper surface of the gate electrode, and at the same time suppress silicide aggregation on the diffusion layer.

In the semiconductor devices and the methods of fabricating the same according to the embodiments as described above, it is possible to form metallized gate electrodes and prevent depletion by forming contact holes on silicided gate electrodes and diffusion layers.

The above embodiments are merely examples and do not limit the present invention. For example, NiSi is used as a metal silicide in the first embodiment. However, it is also possible to use a silicon compound containing at least one of Ni, Pd, Pt, Co, Ti, Zr, and Hf, e.g., $Ni_2Si$, $Pt_2Si$, PtSi, $Pd_2Si$, PdSi, $CO_2Si$, CoSi, $CoSi_2$, TiSi, $TiSi_2$, ZrSi, $ZrSi_2$, HfSi, or $HfSi_2$.

Furthermore, the material of a silicide formed on the gate electrode can be different from that of a silicide formed on the diffusion layer.

In the above embodiments, a polysilicon film is used as the gate electrode material. However, another material such as a compound of silicon and germanium may also be used.

In the above embodiments, P is ion-implanted into the polysilicon film in the n-type MOS transistor region, and B ions are implanted into the polysilicon film in the p-type MOS transistor region. However, it is also possible to ion-implant, e.g., As or Sb instead of P, and In or Ga instead of B.

In the above embodiments, annealing is performed after ion implantation in order to diffuse the impurities into the polysilicon films. However, this annealing need not always be performed.

In the above embodiments, $HfSiO_4$ is used as the gate insulating film. However, it is possible to similarly use any insulating film containing Hf or Zr. Examples are $ZrO_2$, $HfO_2$, and $ZrSiO_4$. It is also possible to use a gate insulating film containing La, Ce, Pr, Nd, Pm, Sm, Eu, Gd, Tb, Dy, Ho, Er, or Lu.

In the above embodiments, a silicon nitride film is used as the cap film. However, an SiOC film, $Al_2O_3$ film, or the like may also be used.

The invention claimed is:

1. A semiconductor device fabrication method, comprising:
   forming a gate electrode on a substrate via a gate insulating film by using a silicon-containing material;
   depositing an insulating material on the gate electrode and the substrate, and etching back the insulating material, thereby forming a first insulating film so as to expose a surface of the substrate, and cover surfaces of the gate electrode;
   ion-implanting an impurity by using the gate electrode and the first insulating film as masks, thereby selectively forming a diffusion layer in a surface portion of the substrate;
   forming a first metal film on at least the substrate, and allowing the first metal film to react with the substrate by annealing, thereby forming a silicide film in a surface portion of the diffusion layer;
   forming a second insulating film so as to cover the gate electrode, which is covered with the first insulating film, and the substrate;
   forming a third insulating film as an interlayer insulating film on the second insulating film;
   planarizing the first, second, and third insulating films to a height at which upper surfaces of the gate electrode are exposed;
   removing the third insulating film such that a predetermined selectivity to the second insulating film is obtained;
   forming a second metal film on at least the gate electrode, and allowing the second metal film to react with the gate electrode by annealing, thereby converting the material of the gate electrode into a metal silicide;
   forming a fourth insulating film so as to cover the gate electrode and second insulating film;
   forming a fifth insulating film as an interlayer insulating film on the fourth insulating film;
   planarizing the fifth insulating film;
   processing the fifth insulating film into a shape of a desired contact pattern such that a predetermined selectivity to the fourth insulating film is obtained;
   selectively removing the fourth and second insulating films present on a bottom surface of the contact pattern of the fifth insulating film; and
   forming a contact by burying a conductive material in the contact pattern of the fifth insulating film.

2. A method according to claim 1, wherein the silicide film is a silicon compound containing at least one of Ni, Pd, Pt, Co, Ti, Zr, and Hf.

3. A method according to claim 2, wherein when the material of the gate electrode is converted into the metal silicide, a segregation layer of the impurity doped into the gate electrode is formed in an interface between the metal silicide and the gate insulating film.

4. A method according to claim 3, wherein the segregation layer of the impurity contains one of P, As, and Sb in an n-type transistor and one of B, Ga, and In in a p-type transistor.

5. A method according to claim 1, wherein when the material of the gate electrode is converted into the metal silicide, a segregation layer of the impurity doped into the gate electrode is formed in an interface between the metal silicide and the gate insulating film.

6. A method according to claim 5, wherein the segregation layer of the impurity contains one of P, As, and Sb in an n-type transistor and one of B, Ga, and In in a p-type transistor.

7. A semiconductor device fabrication method, comprising:
   forming a gate electrode on a substrate via a gate insulating film by using a silicon-containing material;
   depositing an insulating material on the gate electrode and the substrate, and etching back the insulating material, thereby forming a first insulating film so as to expose a surface of the substrate and surfaces of the gate electrode, and cover side surfaces of the gate electrode;
   ion-implanting an impurity by using the gate electrode and the first insulating film as masks, thereby selectively forming a diffusion layer in a surface portion of the substrate;
   forming a first metal film on at least the gate electrode and the substrate, and allowing the first metal film to react with silicon contained in the gate electrode and the substrate by annealing, thereby forming a first silicide film in a surface portion of the diffusion layer, and a second silicide film in surface portions of the gate electrode;
   forming a second insulating film so as to cover the gate electrodes and the substrate;
   forming a third insulating film as an interlayer insulating film on the second insulating film;

planarizing the second and third insulating films to a height at which an upper surface of the second silicide film is exposed;

removing the third insulating film such that a predetermined selectivity to the second insulating film is obtained;

forming a second metal film on at least the second silicide film, and allowing the second metal film to react with the second silicide film by annealing, thereby converting the material of the gate electrode into a metal silicide;

forming a fourth insulating film so as to cover the gate electrode and second insulating film;

forming a fifth insulating film as an interlayer insulating film on the fourth insulating film;

planarizing the fifth insulating film;

processing the fifth insulating film into a shape of a desired contact pattern such that a predetermined selectivity to the fourth insulating film is obtained;

selectively removing the fourth and second insulating.

8. A method according to claim 7, wherein each of the first silicide film and the second silicide film is a silicon compound containing at least one of Ni, Pd, Pt, Co, Ti, Zr, and Hf.

9. A method according to claim 8, wherein when the material of the gate electrode is converted into the metal silicide, a segregation layer of the impurity doped into the gate electrode is formed in an interface between the metal silicide and the gate insulating film.

10. A method according to claim 9, wherein the segregation layer of the impurity contains one of P, As, and Sb in an n-type transistor and one of B, Ga, and In in a p-type transistor.

11. A method according to claim 7, wherein when the material of the gate electrode is converted into the metal silicide, a segregation layer of the impurity doped into the gate electrode is formed in an interface between the metal silicide and the gate insulating film.

12. A method according to claim 11, wherein the segregation layer of the impurity contains one of P, As, and Sb in an n-type transistor and one of B, Ga, and In in a p-type transistor.

* * * * *

UNITED STATES PATENT AND TRADEMARK OFFICE
CERTIFICATE OF CORRECTION

PATENT NO. : 7,045,448 B2
APPLICATION NO. : 10/979275
DATED : May 16, 2006
INVENTOR(S) : Nakajima It is certified that error appears in the above-identified patent and that said Letters Patent is hereby corrected as shown below:

Title page, item (57), line 9, change "suicide" to --silicide--.

Claim 7, column 13, line 20, change "insulating." to --insulating films present on a bottom surface of the contact pattern of the fifth insulating film; and
    forming a contact by burying a conductive material in the contact pattern of the fifth insulating film.--.

Claim 8, column 13, line 22 - column 14, line 1, change "com pound" to --compound--.

Signed and Sealed this

Fifth Day of December, 2006

JON W. DUDAS
*Director of the United States Patent and Trademark Office*